United States Patent
Komuro

[19]

[11] Patent Number: 5,151,616
[45] Date of Patent: Sep. 29, 1992

[54] CMOS HIGH VOLTAGE SWITCH

[75] Inventor: Toshio Komuro, Tokyo, Japan

[73] Assignee: NEC Corporation, Tokyo, Japan

[21] Appl. No.: 644,655

[22] Filed: Jan. 23, 1991

[30] Foreign Application Priority Data

Jan. 23, 1990 [JP] Japan .................................. 2-12975

[51] Int. Cl.⁵ .............................................. H03K 17/16
[52] U.S. Cl. ...................................... 307/451; 307/443
[58] Field of Search .............. 307/450, 451, 452, 453, 307/475, 575, 576, 579, 584, 585, 270, 264, 482, 578, 262, 279, 443; 365/104, 226, 228, 189.11

[56] References Cited

U.S. PATENT DOCUMENTS

| | | | |
|---|---|---|---|
| 4,080,539 | 3/1978 | Stewart | 307/279 X |
| 4,216,390 | 8/1980 | Stewart | 307/279 X |
| 4,506,164 | 3/1985 | Higuchi | 307/475 X |
| 4,638,182 | 1/1987 | McAdams | 307/451 X |
| 4,675,544 | 6/1987 | Schrenk | 307/451 X |
| 4,689,495 | 8/1987 | Liu | 307/475 X |

Primary Examiner—David Hudspeth
Attorney, Agent, or Firm—Sughrue, Mion, Zinn, Macpeak & Seas

[57] ABSTRACT

Two switches are provided to a semiconductor circuit which includes cascade connected first circuit section and second circuit section, each having an inverter formed by complementary transistors connected between a power terminal and a grounding terminal. The first switch is inserted between the first circuit section and the second circuit section and forms a current path of the electrical charge during the state transition of the circuit. The second switch is inserted between the input end and the power terminal of the second circuit section and controlled by the output signal for the second circuit section.

10 Claims, 3 Drawing Sheets

CMOS HIGH VOLTAGE SWITCH

BACKGROUND OF THE INVENTION

1. Field of the Invention

The present invention relates to semiconductor digital circuits, and more particularly to level conversion circuits added to semiconductor circuits. Especially, the present invention relates to semiconductor digital circuits that are formed by connecting two inverters, each consisting of transistors that are complementarily connected between a power supply terminal and a grounding terminal, which are operated at different supply voltages.

2. Description of the Prior Art

In recent years, the short channeling has increasingly been advanced in semiconductor integrated circuits such as a dynamic RAM (DRAM), and by now the development has reached even to cover the submicron region. Accompanying this trend, such problem as the deterioration in the characteristics of the elements due to the implantation of the hot carriers into the transistor has become of concern, and the reduction of the supply voltage to the semiconductor integrated circuits has been implemented as a solution to this problem.

However, for connecting such a semiconductor integrated circuit to an existing peripheral circuit it becomes necessary to provide an interface mechanism which converts a low voltage to a high voltage.

A conventional level conversion circuit with the aforementioned kind of interface mechanism comprises a first and a second inverters each consisting of transistors that are complementarily connected between a power terminal and a grounding terminal, that are operated at different voltages. The output of a semiconductor digital circuit with a low logic swing level is applied to the input of the first inverter for low supply voltage, and the output of the first inverter is applied to the input of the second inverter for high supply voltage. An output signal with high logic swing level is taken out from the output of the second inverter.

For the second inverter it is normal to directly apply an external supply voltage through a terminal of the external power supply, and for the first inverter it is normal to apply the externally supplied source voltage after lowering it with an internal voltage reduction circuit.

In such a prior art semiconductor digital circuit, it is necessary to apply to the input of the second inverter a signal with a supply voltage which is higher than the voltage value obtained by subtracting the absolute value of the threshold voltage of the transistor that is connected to the supply voltage from the external supply voltage, in order to let the output of the second inverter to make a correct transition from the external supply voltage to zero volt.

The reason for this is that if the above-mentioned condition is not fulfilled, the complementarily connected two transistors that constitute the second inverter are both turned on, with the low level of the output signal not going to zero volt, a through current steadily flows continuously in the second inverter, so that the power consumption will be increased.

In addition, there was a problem that the setting range of the supply voltage for the first inverter is limited.

BRIEF SUMMARY OF THE INVENTION

Object of the Invention

It is an object of the present invention to provide semiconductor digital circuits which can prevent the generation of a steady through current and have low power consumption.

SUMMARY OF THE INVENTION

The semiconductor digital circuit in accordance with the present invention comprises a first circuit part having an inverter formed by connecting complementary transistors between a first power terminal and a grounding terminal, a first switch which inputs the output signal of the first circuit part to a first node, a second circuit part having an inverter formed by connecting complementary transistors between a second power terminal and a grounding terminal, operated at a supply voltage higher than the supply voltage of the inverter of the first circuit part, with its input connected to the first node, and a second switch connected to the first node.

The first switch is inserted between the first circuit part and the second circuit part, and forms a charging and discharging path of the electrical charge during the transition of the state. Further, the second switch is inserted between the input end and the second power terminal of the second circuit part, and its conduction is controlled by the output signal of the second circuit part.

It is preferable that the semiconductor digital circuit in accordance with the present invention comprises a first circuit part having an inverter formed by connecting complementary transistors between a first power terminal and a grounding terminal, a second circuit part having an inverter formed by complementarily connecting transistors between a second power terminal and a grounding terminal and is operated at a supply voltage higher than the supply voltage of the inverter of the first circuit part, and three switches.

The first switch is inserted between the first circuit part and the second circuit part, and forms a charging-/discharging path of the electric charge during the transition of the state. The second switch is inserted between the input end and the second power terminal of the second circuit part, and its conduction is controlled by the output signal of the second circuit part.

The third switch is inserted between the output end and the grounding terminal of the second circuit part, and its conduction is controlled by the output signal of the first circuit part so as to output it by inverting.

A fourth switch may be inserted in parallel with the third switch between the output end and the grounding terminal of the second circuit part, and the fourth switch may be controlled by the delayed signal of the output end of the second circuit part.

Further, it is preferable that the semiconductor digital circuit in accordance with the present invention has a switch which is serially connected to the second switch so as to have its output end connected to the input end of the second circuit part, and its shut-off is controlled by the input signal to the first circuit part.

Moreover, it is preferable that in the semiconductor digital circuit in accordance with the present invention the complementarily connected transistors are a P-channel MOS transistor and an N-channel MOS transistor.

BRIEF DESCRIPTION OF THE DRAWINGS

The above-mentioned and other objects, features and advantages of this invention will become more apparent by reference to the following detailed description of the invention taken in conjunction with the accompanying drawing, wherein.

DETAILED DESCRIPTION OF THE INVENTION

Prior to proceeding to the description of the embodiments of the present invention, a description of the prior art semiconductor digital circuit is in order.

Figure 1:
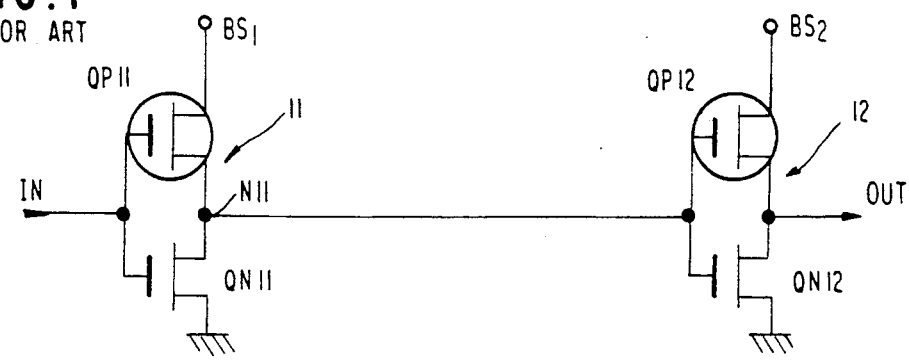
FIG. 1 shows an example of the prior art semiconductor digital circuit.

FIG. 1 shows an example of the prior art semiconductor digital circuit.

This circuit includes a CMOS inverter 11 which is a first circuit part and a CMOS inverter 12 which is a second circuit part where these inverters are connected in cascade fashion.

The CMOS inverter 11 is constituted of a P-channel MOS transistor $QP_{11}$ and an N-channel MOS transistor $QN_{11}$ that are complementarily connected in pair between a first power terminal $BS_1$ and a grounding terminal, and it inverts an input signal IN and outputs its logical output to a node $N_{11}$ which is its output end.

Further, the CMOS inverter 12 is constituted of a P-channel MOS transistor $QP_{12}$ and an N-channel MOS transistor $QN_{12}$ that are complementarily connected in pair between a second power terminal $BS_2$ and a grounding terminal, and it outputs an output signal OUT by inverting the logical output that was output to the node $N_{11}$.

Here, if $V_{C1}$ is a first supply voltage applied to the first power terminal $BS_1$ and $V_{C2}$ is a second supply voltage applied to the second power terminal, then the second supply voltage $V_{C2}$ is a supply voltage applied externally to the semiconductor digital circuit and the first supply voltage $V_{C1}$ is a voltage obtained by lowering the second supply voltage $V_{C2}$ inside the semiconductor digital circuit.

In this level conversion circuit, when the input signal IN changes from a high level ($V_{C1}$) to a low level (0V), the voltage at the node $N_{11}$ changes from 0V to $V_{C1}$. In response to this, the output of the CMOS inverter 12 changes from a high level ($V_{C2}$) to a low level (0V).

In the prior art level conversion circuit described above, in order for the output of the CMOS inverter 12 to change from the $V_{C2}$ level correctly to 0V, it is necessary that the following Eq. (1) is satisfied.

$$V_{C1} > V_{C2} - |V_{TP}|, \quad (1)$$

where $V_{TP}$ is the threshold voltage of the transistor $QP_{12}$.

If the above condition fails to be satisfied, both of the transistors $QP_{12}$ and $QN_{12}$ are energized, the low level of the output OUT does not go to 0V and a through current continues to flow steadily, thereby increasing the power consumption of the circuit.

Because of this, there also was a problem that the setting range of the first supply voltage $V_{C1}$ has to be limited.

Next, referring to FIG. 2 to FIG. 8, the embodiments of the present invention will be described.

Figure 2:
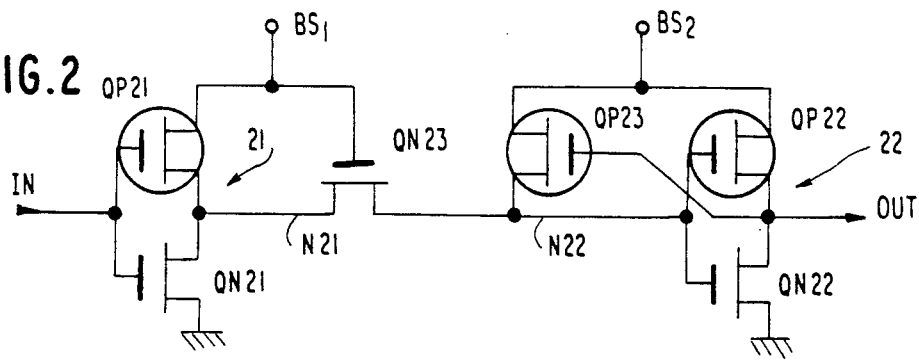
FIG. 2 shows a first embodiment of the semiconductor digital circuit of the present invention.

FIG. 2 shows a level conversion circuit in accordance with the first embodiment of the present invention. This circuit includes a CMOS inverter 21 as a first logic part which is operated by the first supply voltage $V_{C1}$ that is applied to the first power terminal $BS_1$ and a CMOS inverter 22 as a second logic part which is operated by the second supply voltage $V_{C2}$ that is applied to the second power terminal $BS_2$, and these inverters are cascade connected.

The CMOS inverter 21 consists of a P-channel MOS transistor $QP_{21}$ and an N-channel MOS transistor $QN_{21}$ whose gates are commonly connected to the input end and their drains are commonly connected to the output end, with the source of the transistor $QP_{21}$ being connected to the first power terminal $BS_1$ and the source of the transistor $QN_{21}$ being grounded.

Further, the CMOS inverter 22 consists of a P-channel MOS transistor $QP_{22}$ and an N-channel MOS transistor $QN_{22}$, with the source of the transistor $QP_{22}$ being connected to the second power terminal $BS_2$ and the source of the transistor $QN_{22}$ being grounded.

An N-channel MOS transistor $QN_{23}$ is inserted between a node $N_{21}$ which is the output end of the CMOS inverter 21 and a node $N_{22}$ which is the input end of the CMOS inverter 22. The gate of the transistor $QN_{23}$ is connected to the first power terminal $BS_1$. Further, a P-channel MOS transistor $QP_{23}$ as a second switch is inserted between the second power terminal $BS_2$ and the node $N_{22}$. The gate of the transistor $QP_{23}$ is connected to the output end of the CMOS inverter 22.

In the above circuit, when an input signal IN changes from a high level ($V_{C1}$) to a low level (0V), the signal at the node $N_{21}$ changes from a low level (0V) to a high level ($V_{C1}$). At this time, the source side of the transistor $QN_{23}$, namely, the node $N_{22}$, changes from a low level (0V) to a high level ($V_{C1} - V_{TN}$), where $V_{TN}$ represents the threshold voltage of the transistor $QN_{23}$.

In order to cause the output state of the CMOS inverter 22 change from the high level to the low level in this case, it is necessary for the potential $V_{C1} - V_{TN}$ of the node $N_{22}$ to exceed the logic threshold voltage $V_{TL}$ of the CMOS inverter 22. That is, it is necessary to adjust in the design stage the gain constants of the transistors $QP_{22}$ and $QN_{22}$ so as to satisfy the relation given in Eq. (2) below.

$$V_{TL} < V_{C1} - V_{TN} \quad (2)$$

More specifically, the logic threshold voltage $V_{TL}$ need be set at a low value by setting the gain constant of the transistor $QN_{22}$ to be larger than the gain constant of the transistor $QP_{22}$. By so doing it is possible to realize the extension of the operating margin.

When the potential of the node $N_{22}$ exceeds $V_{TL}$, the output signal OUT changes from the $V_{C2}$ level to the low level. In this process, when the level of the output signal OUT is reduced from $V_{C2}$ by the amount corresponding to the threshold voltage of the transistor $QP_{23}$, the transistor $QP_{23}$ starts to be energized so that the potential of the node $N_{22}$ is raised further until eventually it is elevated to the level of $V_{C2}$. As a result, the transistor $QP_{22}$ which constitutes the CMOS inverter 22 goes to a completely de-energized state, preventing the steady flow of a through current.

It should be noted that when the potential of the node $N_{22}$ is raised to the level of $V_{C1}$, the transistor $QN_{23}$ goes to a de-energized state so that the eventual potential $V_{C2}$ of the node $N_{22}$ will never be applied directly to the CMOS inverter 21.

On the other hand, when the input signal IN changes from a low level (0V) to a high level ($V_{C1}$), the potential of the node $N_{21}$ changes from a high level ($V_{C1}$) to a low level (0V). Since the transistor $QN_{23}$ is energized as a result of this, the potential of the source side, namely, the node $N_{22}$, changes from a high level ($V_{C2}$) to a low level (0V), and the level of the output signal OUT of the CMOS inverter 22 changes from a low level (0V) to a high level ($V_{C2}$). In response to this, the transistor $QP_{23}$ is de-energized.

Figure 3:
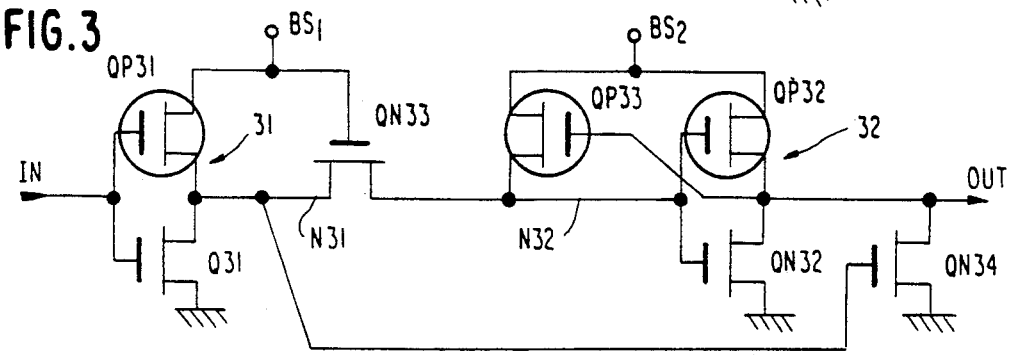
FIG. 3 shows a second embodiment of the semiconductor digital circuit of the present invention.

FIG. 3 is a circuit diagram of the level conversion circuit in accordance with the second embodiment of the present invention.

The difference of this circuit from the circuit of the first embodiment shown in FIG. 2 resides in that an N-channel MOS transistor $QN_{34}$ is connected anew to the output end of the circuit. The drain of the transistor $QN_{34}$ is connected to the output end of a CMOS inverter 32, its source is grounded and its gate is connected to the output end a CMOS inverter 31.

The remaining constitution of the present embodiment is the same as that in FIG. 2, with the CMOS inverters 31 and 32, the transistors $QP_{31}$, $QP_{32}$, $QP_{33}$, $QN_{31}$, $QN_{32}$ and $QN_{33}$ and the nodes $N_{31}$ and $N_{32}$ correspond to the CMOS inverters 21 and 22, the transistors $QP_{21}$, $QP_{22}$, $QP_{23}$, $QN_{21}$, $QN_{22}$ and $QN_{23}$ and the nodes $N_{21}$ and $N_{22}$, respectively. Accordingly, the description of these parts of the present embodiment will be omitted.

In accordance with the present embodiment, the deviation between the rising characteristic and the falling characteristic of the input signal IN is small compared with that of the first embodiment so that it is possible to improve the transmission characteristic of the circuit.

Namely, in the first embodiment, the characteristic at the time of falling of the output signal OUT is arranged to be improved by lowering the threshold voltage $V_{TL}$ of the CMOS inverter 22. However, in accordance with the present embodiment, the falling characteristic of the output signal OUT is improved by directly driving the transistor $QN_{34}$ with the output of the CMOS inverter 31, so that it is possible to realize an improvement of the transmission characteristic by raising the logic threshold of the CMOS inverter 32 to the conventional value.

Figure 4:
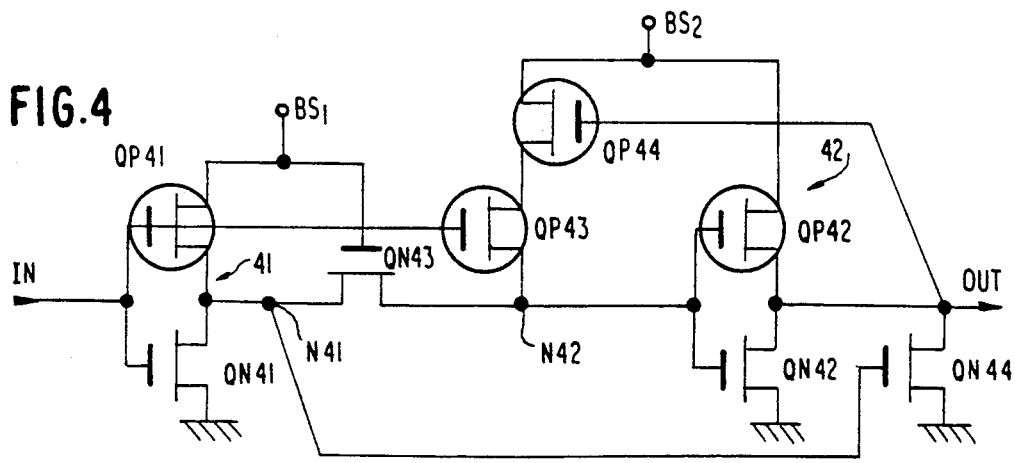
FIG. 4 shows a third embodiment of the semiconductor digital circuit of the present invention.

FIG. 4 is a circuit diagram of the level conversion circuit in accordance with the third embodiment of the present invention.

The difference of the circuit of the present embodiment from the circuit of the second embodiment resides in that a P-channel MOS transistor $QP_{44}$ is inserted anew in addition to a P-channel MOS transistor $QP_{43}$ between the input end and the second power terminal $BS_2$ of a post-stage CMOS inverter 42.

The drain of the transistor $QP_{44}$ is connected to the input end of the CMOS inverter 42, its source is connected to the drain of the transistor $QP_{43}$ and its gates is connected to the input end of a CMOS inverter 41.

The remaining constitution is the same as that in FIG. 3, and the CMOS inverters 41 and 42, the transistors $QP_{41}$, $QP_{42}$, $QP_{43}$, $QN_{41}$, $QN_{42}$, $QN_{43}$ and $QN_{44}$, and the nodes $N_{41}$ and $N_{42}$ correspond to the CMOS inverters 31 and 32, the transistors $QP_{31}$, $QP_{32}$, $QP_{33}$, $QN_{31}$, $QN_{32}$, $QN_{33}$ and $QN_{34}$, and the nodes $N_{31}$ and $N_{32}$, respectively. Accordingly, the description on these parts of the present embodiment will be omitted.

In accordance with the present embodiment it is possible to further improve the transmission characteristic at the time of rising of the output signal OUT than that of the second embodiment. Namely, in the second embodiment, when the input signal IN goes to a high level, the output signal OUT is at a low level, so that there is a current which flows out of the second power terminal $BS_2$ and flows into the transistor $QN_{31}$ via the transistors $QP_{33}$ and $QN_{33}$, and it takes some time for the discharging at the nodes $N_{31}$ and $N_{32}$.

In contrast, according to the circuit of the present embodiment, there is inserted a transistor $QP_{44}$ in the above-mentioned current path which goes to an interrupted state at the time of rise of the input signal IN so that it is possible to improve the transmission characteristic.

Figure 5:
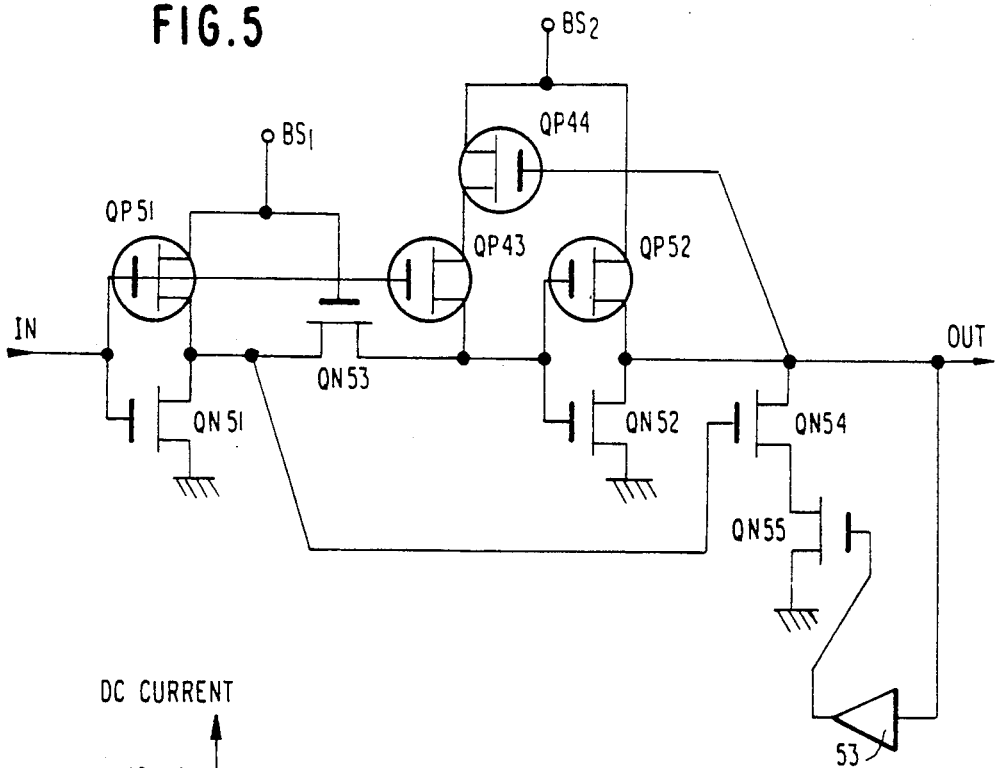
FIG. 5 shows a fourth embodiment of the semiconductor digital circuit of the present invention.

FIG. 5 is a circuit diagram of the level conversion circuit in accordance with the fourth embodiment of the present invention.

The difference of the circuit of this embodiment from the circuit of the third embodiment resides in that an N-channel MOS transistor $QN_{55}$ is inserted anew between a transistor $QN_{54}$ and a grounding of the output stage, and the output signal OUT is input to the gate of the transistor $QN_{55}$ via a delay circuit 53.

The remaining constitution is the same as that in FIG. 4, and the CMOS inverters 51 and 52, the transistors $QP_{51}$, $QP_{52}$, $QP_{53}$, $QP_{54}$, $QN_{51}$, $QN_{52}$, $QN_{53}$ and $QN_{54}$, and the nodes $N_{51}$ and $N_{52}$, correspond to the CMOS inverters 41 and 42, the transistors $QP_{41}$, $QP_{42}$, $QP_{43}$, $QP_{44}$, $QN_{41}$, $QN_{42}$, $QN_{43}$ and $QN_{44}$, and the nodes $N_{41}$ and $N_{42}$, respectively. Accordingly, the description about these parts of the present embodiment will be omitted.

In the present embodiment, the transistor $QN_{55}$ is turned off following a lapse of a predetermined length of time after a fall of the output signal OUT, so that the series circuit of the transistors $QN_{54}$ and $QN_{55}$ is energized only at the instant of the fall of the output signal OUT, which acts to lower the logic threshold. Because of this, it is possible to improve the resistance to the noise by preventing the malfunction of the CMOS inverter 52 due to the voltage drop within the integrated circuit after the change of the output signal OUT.

As described in the above, in accordance with the present invention the second switch is energized in response to the output change of the second circuit part, making it possible to use the signal at the input end of the second circuit part as the second supply voltage level, so that there will be no flow of a steady through current in the second circuit part and a reduction in the power consumption can be realized.

Moreover, it is possible to extend the setting range of the first supply voltage.

Figure 6:
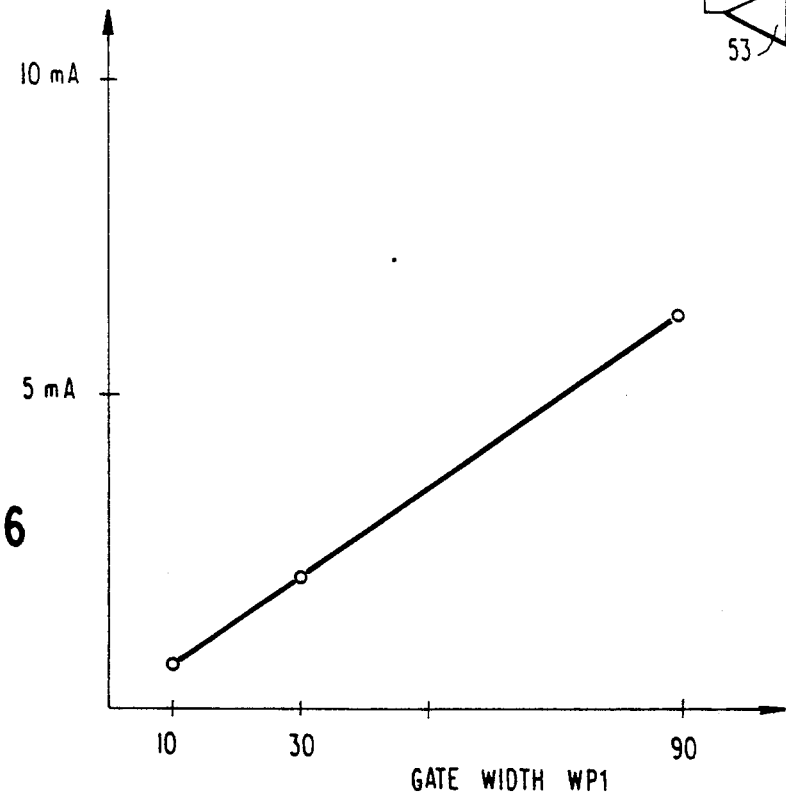
FIG. 6 is a graph for displaying the effect of the semiconductor digital circuit of the present invention.

FIG. 6 is a graph illustrating the dependence of the dc current in the driver on the gate width taken of the prior art, presented for the purpose of showing the effect of the present invention.

The conventional model used in the above has the same circuit as that shown in FIG. 1, and the various constants are set as in the following.

$$WP_1: WN_1 = WP_2: WN_2 = 2:1,$$

$$WP_2 = 3 WP_1.$$

$$L_P = 1.0 \ \mu m, \ L_N = 0.8 \ \mu m.$$

$$V_{C1} = 3.3V, \ V_{C2} = 5V.$$

In the above equations, $WP_1$, $WP_2$, $WN_1$ and $WN_2$ are the gate widths of the P-channel MOS transistor $QP_{11}$, the P-channel MOS transistor $QP_{12}$, the N-channel MOS transistor $QN_{11}$ and the N-channel MOS transistor $QN_{12}$, respectively, and $L_P$ and $L_N$ are the gate lengths of the P-channel MOS transistors $QP_{11}$ and $QP_{12}$, and the N-channel MOS transistors $QN_{11}$ and $QN_{12}$, respectively.

As can be seen from the figure, in the conventional level conversion circuit there is a flow of a through current in the range of 10 $\mu A$ to 100 $\mu A$ depending upon the dimensions of the transistors used. In contrast, this current can be made equal to zero under the identical conditions according to the present invention.

It should be noted that the description has been presented in conjunction with the case of using the CMOS inverters for the first and the second circuits parts in each of the aforementioned embodiments, but it is needless to say that the present invention can also be applied to other logic gates.

Figure 7:
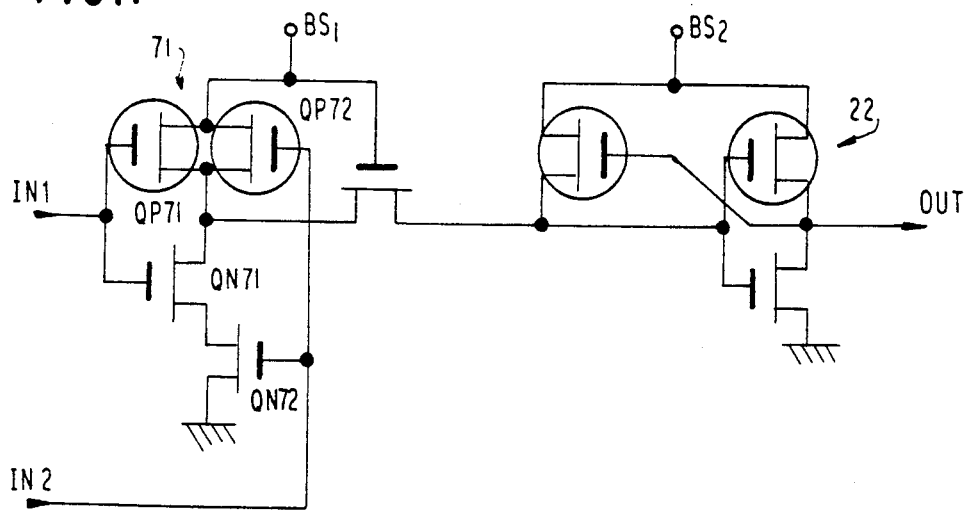
FIG. 7 shows a fifth embodiment of the semiconductor digital circuit of the present invention.

For example, FIG. 7 shows the case of replacing the first stage MOS inverter 21 in FIG. 2 by a NAND gate 71. The second stage of FIG. 7 remains the same as in FIG. 2. The NAND gate 71 is constituted of two P-channel MOS transistors $QP_{71}$ and $QP_{72}$ and two N-channel MOS transistors $QN_{71}$ and $QN_{72}$. This example corresponds to the case where the output stage of an internal digital circuit with small logic swing level is constituted not of an inverter but of a NAND gate, and the level of its output is connected by a second stage inverter.

Figure 8:
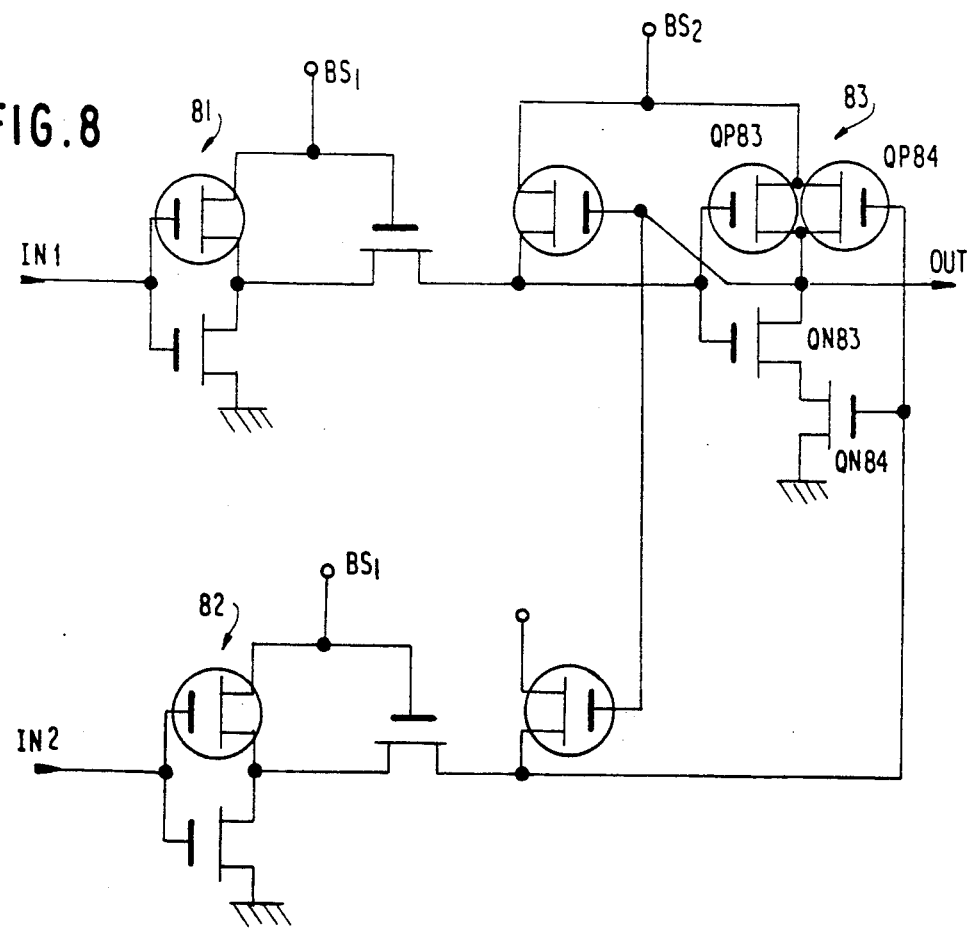
FIG. 8 shows a sixth embodiment of the semiconductor digital circuit of the present invention.

Moreover, in the embodiment shown in FIG. 8 the first stage MOS inverter 21 in FIG. 2 is replaced by two MOS inverters (81 and 82), and the second stage MOS inverter 22 is replaced by a NAND gate 83. The NAND gate 83 consists of two P-channel MOS transistors $QP_{83}$ and $QP_{84}$, and two N-channel MOS transistors $QN_{83}$ and $QN_{84}$. This represents an example where the second stage inverter is served for both of a level converter and a NAND gate for the output stage of an internal digital circuit.

Although the invention has been described with reference to specific embodiments, this description is not meant to be construed in a limiting sense. Various modifications of the disclosed embodiments will become apparent to persons skilled in the art upon reference to the description of the invention. It is therefore, contemplated that the appended claims will cover any modifications or embodiments as fall within the true scope of the invention.

What is claimed is:

1. A semiconductor digital circuit comprising:
    a first circuit section having complementary transistors connected between a first power terminal receiving a first voltage and a grounding terminal;
    a second circuit section having complementary transistors connected between a second power terminal receiving a second voltage different from said first voltage and said grounding terminal;
    a first switch inserted between an output end of said first circuit section and an input end of said second circuit section operatively serving as a current path of the electric charge therebetween during a transition state of the circuit;
    a second switch inserted between the input end of said second circuit section and said second power terminal and controlled by the output signal of said second circuit section; and
    a third switch inserted between the output end and the grounding terminal of said second circuit section and controlled by the output signal of said first circuit section.

2. A semiconductor digital circuit as claimed in claim 1, further comprising a fourth switch connected in series with said third switch between the output end and the grounding terminal of said second circuit section, and a delay circuit for delaying the output signal of said second circuit section to produce a delayed signal, said fourth switch being controlled by said delayed signal.

3. A semiconductor digital circuit as claimed in claim 2, further comprising a fifth switch connected in series with said second switch between the input end of said second circuit section and said second power terminal and controlled by an input signal supplied to said first circuit section.

4. A semiconductor digital circuit as claimed in claim 1, wherein said complementary transistors are a P-channel MOS transistor and an N-channel MOS transistor.

5. A semiconductor digital circuit comprising:
    a first circuit section having complementary transistors connected between a first power terminal receiving a first voltage and a grounding terminal;
    a second circuit section having complementary transistors connected between a second power terminal receiving a second voltage different from said first voltage and said grounding terminal;
    a first switch inserted between an output end of said first circuit section and an input end of said second circuit section operatively serving as a current path of the electric charge therebetween during a transition state of the circuit;
    a second switch inserted between the input end of said second circuit section and said second power terminal and controlled by the output signal of said second circuit section;
    a third switch inserted between the output end and the grounding terminal of said second circuit section and controlled by the output signal of said first circuit section; and
    a fourth switch connected in series with said second switch between said second power terminal and the input end of said second circuit section and controlled by an input signal supplied to said first circuit section.

6. A semiconductor digital circuit comprising a complementary MOS circuit connected between a first power terminal and a reference terminal and having an input node and an output node, said first terminal receiving a first voltage, said complemenary MOS circuit producing an output signal at said output node in response to an input signal supplied to said input node, a circuit node, a first MOS transistor of a first channel type connected between said output node and said circuit node and having a gate connected to said first power terminal, an output terminal, a second power terminal receiving a second voltage that is different from said first voltage, a second MOS transistor of a second channel type connected between said second power terminal and said output terminal and having a gate connected to said circuit node, a third MOS transistor of said first channel type connected between said output terminal and said reference terminal and having a gate connected to said output node of said complementary MOS circuit without intervention of said first MOS transistor, and a fourth MOS transistor of said second channel type connected between said second power terminal and said circuit node and having a gate connected to said output terminal.

7. A semiconductor digital circuit as claimed in claim 6, further comprising a fifth MOS transistor of said second channel type inserted in series with said fourth MOS transistor between said second power terminal and said circuit node and having a gate connected to said input node of said complementary MOS circuit.

8. A semiconductor digital circuit as claimed in claim 6, further comprising a fifth MOS transistor of said first channel type inserted in series with said third MOS transistor between said output terminal and said reference terminal and having a gate, and a delay circuit connected between said output terminal and the gate of said fifth MOS transistor.

9. A semiconductor digital circuit comprising a first circuit having a first input node and a first output node and connected between a first power terminal receiving a first voltage and a reference terminal, a second circuit having a second input node and a second output node and connected between a second power terminal and said reference terminal, said second power terminal receiving a second voltage that is different from said first voltage, a first transistor of one conductivity type connected between said first output node and said second input node and having a gate connected to said first power terminal, a second transistor of an opposite conductivity type connected between said second power terminal and said second input node and having a gate connected to said second output node, and a third transistor of said opposite conductivity type inserted in series with said second transistor between said second power terminal and said second input node and having a gate connected to said first input node.

10. A semiconductor digital circuit as claimed in claim 9, further comprising a fourth transistor of said one conductivity type connected between said second output node and said reference terminal and having a gate connected to said first output node.

* * * * *